(12) United States Patent
Miyasaka et al.

(10) Patent No.: US 7,736,834 B2
(45) Date of Patent: Jun. 15, 2010

(54) PHOTOSENSITIVE RESIN COMPOSITION, PHOTOSENSITIVE ELEMENT EMPLOYING IT, RESIST PATTERN FORMING METHOD, PROCESS FOR MANUFACTURING PRINTED CIRCUIT BOARD AND METHOD FOR REMOVING PHOTOCURED PRODUCT

(75) Inventors: Masahiro Miyasaka, Hitachi (JP); Toshiki Ito, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 414 days.

(21) Appl. No.: 10/569,734

(22) PCT Filed: Aug. 25, 2004

(86) PCT No.: PCT/JP2004/012209

§ 371 (c)(1),
(2), (4) Date: Nov. 2, 2006

(87) PCT Pub. No.: WO2005/022260

PCT Pub. Date: Mar. 10, 2005

(65) Prior Publication Data

US 2007/0111136 A1    May 17, 2007

(30) Foreign Application Priority Data

Aug. 28, 2003 (JP) .......................... P2003-305340
Aug. 28, 2003 (JP) .......................... P2003-305352
Aug. 28, 2003 (JP) .......................... P2003-305357

(51) Int. Cl.
*G03F 7/00* (2006.01)
*G03F 7/004* (2006.01)

(52) U.S. Cl. .............. 430/270.1; 430/281.1; 430/284.1; 430/286.1; 430/287.1; 430/311; 430/314; 430/330

(58) Field of Classification Search .............. 430/270.1, 430/281.1, 284.1, 286.1, 287.1, 311, 314, 430/330
See application file for complete search history.

(56) References Cited

U.S. PATENT DOCUMENTS 4,902,440 A * 2/1990 Takeyama et al. ...... 252/182.18
4,994,208 A * 2/1991 McBain et al. ............... 252/586

(Continued)

FOREIGN PATENT DOCUMENTS

JP          02-105870          4/1990

(Continued)

OTHER PUBLICATIONS

Enghlish language machine translation of JP 07319154 A.*

(Continued)

*Primary Examiner*—Amanda C. Walke
(74) *Attorney, Agent, or Firm*—Antonelli, Terry, Stout & Kraus, LLP.

(57) ABSTRACT

The photosensitive resin composition of the invention comprises (A) a photopolymerizing compound with two or more ethylenic unsaturated bonds in the molecule and (B) a photopolymerization initiator which initiates photopolymerization reaction of the (A) photopolymerizing compound, the photosensitive resin composition being characterized in that the molecule of the (A) photopolymerizing compound further contains a characteristic group with a bond which breaks when the (A) photopolymerizing compound is heated under temperature conditions of 130-250° C.

17 Claims, 1 Drawing Sheet

U.S. PATENT DOCUMENTS 5,621,119 A * 4/1997 Podszun et al. ............. 549/229
5,879,591 A * 3/1999 Nagoh et al. ................. 252/586

FOREIGN PATENT DOCUMENTS

| JP | 4-227763 | 8/1992 |
| JP | 06-301206 | 10/1994 |
| JP | 07-056334 | 3/1995 |
| JP | 07-092673 | 4/1995 |
| JP | 07-134407 | 5/1995 |
| JP | 07-281432 | 10/1995 |
| JP | 07-319153 | 12/1995 |
| JP | 07-319154 | 12/1995 |
| JP | 10-142789 | 5/1998 |
| JP | 11-218910 | 8/1999 |
| JP | 11-327137 | 11/1999 |
| JP | 2000-029212 | 1/2000 |
| JP | 2000-212248 | 8/2000 |
| JP | 2001-117225 | 4/2001 |
| JP | 2002-155114 | 5/2002 |
| JP | 2002-258476 | 9/2002 |
| JP | 2003-177534 | 5/2003 |
| JP | 2003-195497 | 7/2003 |
| JP | 3458000 | 8/2003 |
| JP | 2003-268124 | 9/2003 |
| JP | 2004-037726 | 2/2004 |
| JP | 2004-095773 | 3/2004 |
| JP | 2005-070655 | 3/2005 |
| JP | 2006161030 A * | 6/2006 |

OTHER PUBLICATIONS

Translation of the International Preliminary Report on Patentability, for Application No. PCT/JP2004/012209, dated Jun. 22, 2006.
M. Shirai, "Resoluble Photocrosslinked Polymer", *Expected Materials for the Future*, vol. 2, No. 9, pp. 20-25.
H. Otsuka, et al., "Synthesis and Dissociation Behavior of Crosslinked Polymers Having Hemiacetal Ester Structure on the Bridge", *Polymer Reprints*, vol. 48, No. 8, pp. 1635-1636 (1999).
Korean Official Action issued on Feb. 15, 2007, for Korean Application No. 10-2006-7003687.
Japanese Official Action dated Mar. 16, 2010, for Application No. 2005-513446.

* cited by examiner

PHOTOSENSITIVE RESIN COMPOSITION, PHOTOSENSITIVE ELEMENT EMPLOYING IT, RESIST PATTERN FORMING METHOD, PROCESS FOR MANUFACTURING PRINTED CIRCUIT BOARD AND METHOD FOR REMOVING PHOTOCURED PRODUCT

TECHNICAL FIELD

The present invention relates to a photosensitive resin composition, a photosensitive element employing it, a resist pattern forming method, a process for manufacturing a printed circuit board and a method for removing a photocured product.

BACKGROUND ART

Photosensitive resin compositions and photosensitive elements obtained by laminating them onto support films and covering them with protective films are widely used as resist materials for etching, plating, and the like in the field of printed circuit board manufacturing.

The following method is ordinarily employed for manufacture of printed circuit boards. Specifically, the photosensitive resin composition is laminated on a circuit-forming board (copper board, etc.) and active light rays are irradiated on prescribed areas of the photosensitive resin composition (pattern exposure) for photocuring of the exposed sections, and then the uncured sections are removed with a developing solution (development) to form a resist pattern. The resist pattern-formed board is then subjected to etching or plating to form a pattern, and then the cured sections (resist pattern) are released from the board.

Removal of the uncured sections is usually accomplished using an aqueous alkali solution as the developing solution. The aqueous alkali solution may be, for example, a 0.1-5 wt % sodium carbonate dilute solution or a 0.1-5 wt % potassium carbonate dilute solution. The main purpose of the developing treatment is dissolution removal of the uncured sections, but the cured sections may also swell, while not dissolving, in the developing solution. Such swelling of the cured sections produces poor adhesion or line width bloating of the resist pattern, and has constituted a major cause of reduced resolution. In order to improve the resolution, therefore, it is effective to design a photosensitive resin composition which can form cured sections resistant to swelling in aqueous alkali solutions.

On the other hand, the cured sections (resist pattern) are released with a stronger alkali aqueous solution than the aqueous alkali solution used for development. As strong alkali aqueous solutions there are used, for example, 1-10 wt % aqueous sodium hydroxide or 1-10 wt % aqueous potassium hydroxide. The principle for removal of the cured sections is based on stress produced by swelling, and reduced adhesion with the board. In order to improve the removability of the cured sections, therefore, it is effective to design a photosensitive resin composition which can form cured sections which easily swell in aqueous alkali solutions.

In other words, there is a trade-off between resolution and removability, and consequently it has been difficult to achieve a high level of both qualities. In particular, it has been difficult to obtain photosensitive resin compositions with excellent resolution capable of forming resist patterns with space widths and line widths of 20 μm and smaller, while also allowing reliable removal of the resist pattern.

Incidentally, many constituent materials for photosensitive resins compositions have been studied in recent years, and for example, there have been proposed photocrosslinking polymers that can be resolubilized by heating, and compositions for forming them (see Non-patent document 1). Also known in the field of thermosetting resins are crosslinking polymers having such properties as to dissociate upon external stimuli such as heat, and compositions for forming them (see Non-patent document 2).

Non-patent document 1: Shiroi, M. "Mirai Zairyo", Vol. 2, No. 9, p. 20-25, 2002

Non-patent document 2: Otsuka, H. "Kobunshi Gakkai Yokoshu", Vol. 48, No. 8, p. 1635-1636, 1999

DISCLOSURE OF THE INVENTION

Problems to be Solved by the Invention

However, the compositions described in Non-patent document 1 employ epoxy group-containing monomers as crosslinking agents, and the present inventors have found that when they are used for manufacture of printed circuit boards requiring high density and high resolution (especially 20 μm and smaller) they lack sufficient sensitivity, resolution and developing properties, while photocrosslinking polymers formed by the compositions do not exhibit adequate removability.

Moreover, the compositions described in Non-patent document 2 are thermosetting resin compositions employing AIBN as the polymerization initiator, and therefore such compositions cannot be easily used for resist pattern forming methods or printed circuit board manufacturing methods wherein the photocured sections are formed by irradiation of active light rays.

Incidentally, it is known in the field of photosensitive resin compositions that formed resist patterns can be further hardened by post-heat treatment. Post-heat treatment can accelerate polymerization of the compounds in the photosensitive resin composition to form a harder resist pattern with better board adhesion. However, resist patterns cured by post-heat treatment also have poorer removability from boards.

Consequently, when a resist pattern is formed using a composition as described in the aforementioned patent document 1 or 2, for example, heating of the resist pattern causes decomposition and competitive polymerization reaction, resulting in an insufficient effect of improving the resolution and removability, and merely complicating the manufacturing steps. It has been particularly difficult to form resist patterns with space widths or line widths of 20 μm or smaller, and to reliably remove such resist patterns.

The present invention has been accomplished in light of the aforementioned problems of the prior art, and its object is to provide a photosensitive resin composition capable of adequately improving removability while maintaining excellent resolution (especially 20 μm or smaller), as well as a photosensitive element employing the composition, a resist pattern forming method, a process for manufacturing a printed circuit board and a method for removing a photocured product.

Means for Solving the Problems

As a result of much diligent research directed toward achieving the aforestated object, the present inventors have found that this object can be achieved by a photosensitive resin composition comprising a photopolymerizing compound which decomposes at a specific heating temperature, and a photopolymerization initiator, and have thereupon completed the present invention.

Specifically, the present invention provides a photosensitive resin composition comprising (A) a photopolymerizing compound with two or more ethylenic unsaturated bonds in the molecule and (B) a photopolymerization initiator which initiates photopolymerization reaction of the (A) photopolymerizing compound, the photosensitive resin composition being characterized in that the molecule of the (A) photopolymerizing compound further contains a characteristic group with a bond which breaks when the (A) photopolymerizing compound is heated under temperature conditions of 130-250° C.

This type of photosensitive resin composition allows formation of photocured products with high adhesion for boards and resistance to swelling in developing solutions, and allow excellent resolution to be achieved. As to the removability of the formed photocured product, use of the aforementioned photopolymerizing compound permits decomposition to be achieved by heating of the photocured product at a prescribed temperature, thereby reducing adhesion with the board and facilitating swelling in the solution for removal of the cured product. Here, a photosensitive resin composition according to the invention can drastically increase the rate of heat-induced decomposition with respect to the rate of heat-induced polymerization of the photocured product, thereby vastly improving the removability of the photocured product. In other words, a photosensitive resin composition of the invention eliminates the trade-off between resolution and removability, to allow sufficient improvement in the removability while maintaining excellent resolution. In particular, it is possible to simultaneously achieve excellent resolution whereby a resist pattern can be formed with a space width or line width (resolution) of 20 μm or smaller, and excellent removability for reliable removal of the resist pattern.

The "characteristic group with a bond which breaks when heated under temperature conditions of 130-250° C." in the (A) photopolymerizing compound is a group having a bond which can sufficiently break when a photosensitive resin composition comprising the (A) photopolymerizing compound, a photosensitive resin composition layer composed of the photosensitive resin composition, or a cured product obtained by photocuring the photosensitive resin composition layer, is heated under temperature conditions of 130-250° C. An acid may also be present during the heating. The aforementioned characteristic group does not necessarily need to undergo breakage of all of its bonds under the conditions described above, as it is sufficient if enough bonds break to adequately exhibit the effect of the invention.

The photosensitive resin composition of the invention preferably further comprises (C) a compound which generates an acid upon heating at 130° C. or above or irradiation with active light rays.

This type of photosensitive resin composition allows formation of photocured products with high adhesion for boards and resistance to swelling in developing solutions while also permitting thin photosensitive resin composition layers to be formed, in order to achieve excellent resolution. As to the removability of the formed photocured product, use of the aforementioned photopolymerizing compound permits decomposition to be achieved by heating of the photocured product at a prescribed temperature and promotes decomposition of the photocured product when heated due to the effect of the acid catalyst produced from the compound which yields an acid upon heating at 130° C. or above or irradiation with active light rays, thereby reducing adhesion with the board and facilitating swelling in the solution for removal of the photocured product. Here, a photosensitive resin composition according to the invention can drastically increase the rate of heat-induced decomposition with respect to the rate of heat-induced polymerization of the photocured product, thereby vastly improving the removability of the photocured product. In other words, a photosensitive resin composition of the invention eliminates the trade-off between resolution and removability to a sufficiently high degree which has not been possible according to the prior art, to allow sufficient improvement in the removability while maintaining excellent resolution. In particular, it is possible to simultaneously achieve excellent resolution whereby a resist pattern can be formed with a space width or line width (resolution) of 20 μm or smaller, and excellent removability for reliable removal of the resist pattern.

The photosensitive resin composition of the invention preferably further comprises (D) a binder polymer. Also, the weight-average molecular weight of the (A) photopolymerizing compound is preferably 5,000-300,000.

This type of photosensitive resin composition allows formation of photocured products with high adhesion for boards and resistance to swelling in developing solutions while also achieving excellent resolution. In particular, since such a photosensitive resin composition has a construction comprising either or both (D) a binder polymer and (A) a photopolymerizing compound with a weight-average molecular weight of 5,000-300,000, it is possible to improve the coatability of the photosensitive resin composition while adequately preventing brittleness of the photocured product. As to the removability of the formed photocured product, use of the aforementioned photopolymerizing compound permits decomposition to be achieved by heating of the photocured product at a prescribed temperature, reduces adhesion with the board and facilitates swelling in the solution for removal of the cured product. Here, a photosensitive resin composition according to the invention can drastically increase the rate of heat-induced decomposition with respect to the rate of heat-induced polymerization of the photocured product, thereby vastly improving the removability of the photocured product. In other words, a photosensitive resin composition of the invention eliminates the trade-off between resolution and removability, to allow sufficient improvement in the removability while maintaining excellent resolution. In particular, it is possible to simultaneously achieve excellent resolution whereby a resist pattern can be formed with a space width or line width (resolution) of 20 μm or smaller, and excellent removability for reliable removal of the resist pattern.

From the standpoint of adequately exhibiting the effect of the invention as described above, the weight-average molecular weight of the (D) binder polymer is preferably 5,000-300,000 and the acid value is preferably 10-300 mg KOH/g.

The characteristic group in the (A) photopolymerizing compound of the photosensitive resin composition of the invention preferably has a structure represented by the following general formula (1), (2), (3) or (4).

[Chemical Formula 1]

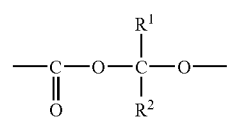

(1)

[in formula (1), $R^1$ and $R^2$ each independently represent hydrogen atom or a C1-20 alkyl group].

[Chemical Formula 2]

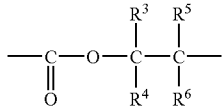

(2)

[in formula (2), $R^3$ and $R^4$ each independently represent a C1-20 alkyl group, and $R^5$ and $R^6$ each independently represent hydrogen atom or a C1-20 alkyl group].

[Chemical Formula 3]

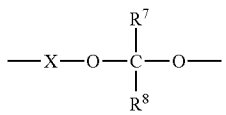

(3)

[in formula (3), $R^7$ and $R^8$ each independently represent hydrogen atom or a C1-20 alkyl group, and X represents a divalent organic group].

[Chemical Formula 4]

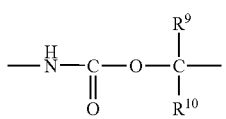

(4)

[in formula (4), $R^9$ and $R^{10}$ each independently represent a C1-20 alkyl group].

A photopolymerizing compound (A) containing a characteristic group with this construction in the molecule will tend to reliably undergo breakage of bonds in the characteristic group upon heating at 130-250° C., while exhibiting excellent removability. It will therefore tend to more satisfactorily exhibit the effect of the invention.

The bonds broken by heating in a characteristic group represented by general formula (1) above may be, for example, the bond between O—C and/or C—O in the group O—C—O (C being the carbon atom bonded to $R^1$ and $R^2$ in general formula (1)). Breakage of these bonds should produce, for example, a compound having the structure represented by general formula (5) below or a compound having the structure represented by general formula (6) below, from the characteristic group represented by general formula (1) above.

[Chemical Formula 5]

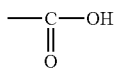

(5)

[Chemical Formula 6]

(6)

The bond broken by heating in a characteristic group represented by general formula (2) or (4) above may be, for example, the bond between O—C' in the group C—O—C' (C' being the carbon atom bonded to $R^3$ and $R^4$ in general formula (2) or the carbon atom bonded to $R^9$ and $R^{10}$ in general formula (4)). Breakage of the bond between O—C' should produce, for example, a compound having the structure represented by general formula (5) above or a compound having the structure represented by general formula (7) below from the characteristic group represented by general formula (2) above, or it should produce, for example, a compound having the structure represented by general formula (8) below or a compound having the structure represented by general formula (9) below from the characteristic group represented by general formula (4) above.

[Chemical Formula 7]

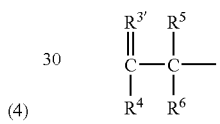

(7)

[in formula (7), $R^{3'}$ is a group obtained by removing one hydrogen atom from the carbon atom adjacent to C' of the carbon atoms of $R^3$].

[Chemical Formula 8]

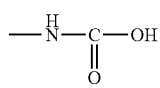

(8)

[Chemical Formula 9]

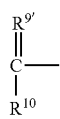

(9)

[in formula (9), $R^{9'}$ is a group obtained by removing one hydrogen atom from the carbon atom adjacent to C' of the carbon atoms of $R^9$].

As a result of cleaving the characteristic group represented by general formula (1), (2) or (4) above, the photocured product is left with a carboxyl group represented by general formula (5) or (8) above, which facilitates swelling in aqueous alkali solutions and the like for removal of the photocured product, and drastically improves the removability of the photocured product.

Also, the bond broken by heating in a characteristic group represented by general formula (3) above may be, for example, the bond between O—C and/or C—O in the group O—C—O (C being the carbon atom bonded to $R^7$ and $R^8$ in general formula (3)). Breakage of these bonds should produce, for example, a compound having the structure represented by general formula (10) below or a compound having the structure represented by general formula (11) below, from the characteristic group represented by general formula (3) above.

[Chemical Formula 10]

(10)

[in formula (10), X represents a divalent organic group].

[Chemical Formula 11]

(11)

As a result of cleaving the characteristic group represented by general formula (3) above, the photocured product is left with a hydroxyl group represented by general formula (10) above, which facilitates swelling in aqueous alkali solutions and the like for removal of the photocured product, and drastically improves the removability of the photocured product.

The invention further provides a photosensitive element characterized by comprising a support film and a photosensitive resin composition layer composed of the aforementioned photosensitive resin composition formed on the support film.

Since the photosensitive element comprises a photosensitive resin composition layer composed of a photosensitive resin composition of the invention which exhibits the effect described above, it is possible to achieve high levels of both resolution and removability, while improving manageability and yield for manufacture of printed circuit boards using the photosensitive element.

The invention still further provides a resist pattern forming method characterized by laminating a photosensitive resin composition layer composed of the aforementioned photosensitive resin composition or the photosensitive resin composition layer of the aforementioned photosensitive element, onto a circuit-forming board, exposing prescribed sections of the photosensitive resin composition layer to active light rays for photocuring of the exposed sections, and then removing the non-exposed sections.

Since this resist pattern forming method employs a photosensitive resin composition of the invention or a photosensitive element of the invention exhibiting the effect described above, it is possible to achieve excellent resolution while forming a resist pattern with excellent removability.

The invention still further provides a process for manufacturing a printed circuit board, characterized by comprising a circuit-forming step in which a circuit-forming board having a resist pattern formed thereon by the aforementioned resist pattern forming method is subjected to etching or plating, and a removal step in which the resist pattern is removed from the circuit-forming board either during or after heating to 130-250° C.

According to this manufacturing process, removal of a resist pattern formed using a photosensitive resin composition of the invention as described above is carried out either during or after heating to 130-250° C., thereby allowing the bonds of the characteristic group in the photopolymerizing compound to easily break by heating, such that adhesion of the resist pattern with the circuit-forming board is reduced, swelling in the developing solution is facilitated, and the resist pattern can thus be easily and reliably removed. Of particular value is that removal can be reliably achieved when the resist pattern has been formed with a space width or line width of 20 μm or smaller.

From the standpoint of more reliably achieving the aforementioned effect, the removal of the resist pattern in the removal step is preferably carried out using an aqueous alkali solution, and the heating time for the resist pattern is preferably one minute or longer.

The invention still further provides a method for removing photocured products characterized in that a photocured product obtained by laminating a photosensitive resin composition layer composed of the aforementioned photosensitive resin composition or the photosensitive resin composition of the aforementioned photosensitive element, onto a support board and exposing it to active light rays for photocuring of the photosensitive resin composition layer, is removed from the support board either during or after heating to 130-250° C.

The method for removing a photocured product does not have to be applied to the aforementioned process for manufacturing a printed circuit board, and may be applied as necessary without restrictions to any purpose which requires removal of a photosensitive resin composition after its photocuring. Moreover, since the method for removing a photocured product employs a photosensitive resin composition of the invention or a photosensitive element of the invention exhibiting the effect described above, it is possible to carry out the removal during or after heating to 130-250° C., thereby allowing easy and reliable removal from support boards.

From the standpoint of more reliably exhibiting the aforementioned effect, the removal of the photocured product is preferably carried out using an aqueous alkali solution, and the heating time for the photocured product is preferably one minute or longer.

Effect of the Invention

According to the present invention, it is possible to provide a photosensitive resin composition, a photosensitive element, a resist pattern forming method, a process for manufacturing a printed circuit board and a method for removing a photocured product, which allow removability to be satisfactorily improved while maintaining excellent resolution.

EXPLANATION OF SYMBOLS

Figure 1:
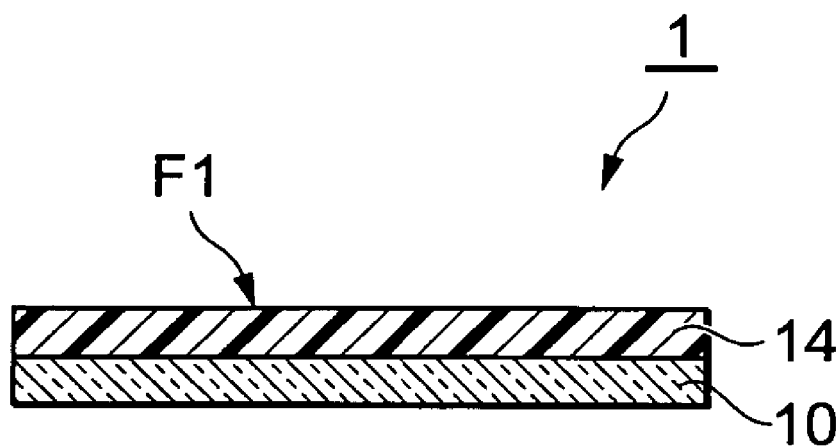
FIG. 1 is a schematic cross-sectional diagram showing a preferred embodiment of a photosensitive element according to the invention.

1: Photosensitive element, 10: Support film, 14: Photosensitive resin composition layer

BEST MODE FOR CARRYING OUT THE INVENTION

Preferred modes of the invention will now be explained in detail with reference to the accompanying drawings as necessary. "(Meth)acrylic acid" according to the invention refers to an acrylic acid or its corresponding methacrylic acid, "(meth)acrylate" refers to an acrylate or its corresponding methacrylate, and "(meth)acryloyl group" refers to an acryloyl group or its corresponding methacryloyl group.

(Photosensitive Resin Composition)

As explained above, the photosensitive resin composition of the invention is a photosensitive resin composition comprising the following components (A) and (B):
- (A) a photopolymerizing compound with two or more ethylenic unsaturated bonds in the molecule,
- (B) a photopolymerization initiator which initiates photopolymerization reaction of the (A) photopolymerizing compound, characterized in that the molecule of the (A) photopolymerizing compound further contains a characteristic group with a bond which breaks when the (A) photopolymerizing compound is heated under temperature conditions of 130-250° C.

The photosensitive resin composition of the invention preferably further comprises, in addition to the aforementioned components (A) and (B), also the following components (C) and/or (D):
- (C) a compound which generates an acid upon heating at 130° C. or above or irradiation with active light rays (hereinafter referred to as "acid generator"),
- (D) a binder polymer.

Components (A) to (D) will now be explained in greater detail.

The (A) photopolymerizing compound will be explained first.

The (A) photopolymerizing compound is a compound having the structure described above, wherein heating of the compound under temperature conditions of 130-250° C. breaks bonds in the aforementioned characteristic group.

The characteristic group having a bond which breaks upon heating of the (A) photopolymerizing compound under temperature conditions of 130-250° C. is preferably one having a structure represented by general formula (1), (2), (3) or (4) above.

$R^1$ in general formula (1) above must be a hydrogen atom or a C1-20 alkyl group, but it is preferably a C1-20 alkyl group, more preferably a C1-10 alkyl group, and most preferably a C1-5 alkyl group. $R^2$ must also be a hydrogen atom or a C1-20 alkyl group, but it is preferably hydrogen atom or a C1-10 (more preferably C1-5) alkyl group.

$R^3$ and $R^4$ in general formula (2) above must each independently be a C1-20 alkyl group, but the number of carbon atoms of each alkyl group is preferably 1-10 and more preferably 1-5. Also, $R^5$ and $R^6$ must each independently be a hydrogen atom or a C1-20 alkyl group, but they are preferably hydrogen atoms or C1-10 (more preferably C1-5) alkyl groups.

$R^7$ in general formula (3) above must be a hydrogen atom or a C1-20 alkyl group, but it is preferably a C1-20 alkyl group, more preferably a C1-10 alkyl group, and most preferably a C1-5 alkyl group. $R^8$ must also be a hydrogen atom or a C1-20 alkyl group, but it is preferably hydrogen atom or a C1-10 (more preferably C1-5) alkyl group. X must be a divalent organic group, and the divalent organic group is preferably a C1-12 alkylene group or a phenylene group.

$R^9$ and $R^{10}$ in general formula (4) above must each independently be a C1-20 alkyl group, but the number of carbon atoms of each alkyl group is preferably 1-10 and more preferably 1-5.

The (A) photopolymerizing compound must undergo breakage of bonds in the aforementioned characteristic group upon heating at a temperature of 130-250° C., but preferably at a temperature of 130-220° C. and more preferably at a temperature of 150-200° C. The bonds preferably do not break at a heating temperature of below 130° C. because such a situation can lead to undesirable bond breakage in other steps such as solvent drying for formation of the photosensitive resin composition layer. If a heating temperature of above 250° C. is necessary for bond breakage, the heating may cause thermal damage to the formed circuit and reduce working safety.

The (A) photopolymerizing compound having a characteristic group represented by general formula (1) above may be synthesized, for example, in the following manner.

As a first synthesis example of the (A) photopolymerizing compound having a characteristic group represented by general formula (1) above, there may be mentioned addition reaction between a (meth)acrylic monomer having one carboxyl group in the molecule, and a compound having two or more vinyl ether groups in the molecule.

As examples of (meth)acrylic monomers with one carboxyl group in the molecule there may be mentioned (meth)acrylic acid, 2-(meth)acryloyloxyethyl phthalate, 2-(meth)acryloyloxypropyl phthalate, 2-(meth)acryloyloxyethylhexahydro phthalate, 2-(meth)acryloyloxyethyl succinate, β-carboxyethyl acrylate and ω-carboxypolycaprolactone monoacrylate.

As examples of compounds with two or more vinyl ether groups in the molecule there may be mentioned butanediol-1,4-divinylether, cyclohexanedimethanol divinylether, ethyleneglycol divinylether, diethyleneglycol divinylether, triethyleneglycol divinylether, tetraethyleneglycol divinylether, propyleneglycol divinylether, dipropyleneglycol divinylether, tripropyleneglycol divinylether and hexanediol divinylether. These are commercially available from ISP Japan Co., Ltd. and BASF Co., Ltd. In addition to these, there may be mentioned condensation products of polyphenols such as bisphenol or phenol resins and halogenated alkyl vinyl ethers, and reaction products of polyisocyanate compounds and hydroxyalkyl vinyl ethers such as hydroxyethyl vinylether.

As a second synthesis example of the (A) photopolymerizing compound having a characteristic group represented by general formula (1) above, there may be mentioned addition reaction between a (meth)acrylic monomer having one carboxyl group in the molecule, and a compound having one or more (meth)acryloyl groups and one vinyl ether group in the molecule.

As (meth)acrylic monomers having one carboxyl group in the molecule there may be mentioned the same compounds referred to above for the first synthesis example of the (A) photopolymerizing compound having a characteristic group represented by general formula (1) above.

As examples of compounds having one or more (meth)acryloyl groups and one vinyl ether group in the molecule, there may be mentioned compounds synthesized by reaction between a compound obtained by substituting chlorine for the hydroxyl group in the carboxyl group of the aforementioned (meth)acrylic monomer having one carboxyl group in the molecule, and a compound having one or more hydroxyl groups and one vinyl ether group, such as hydroxyethyl vinylether, hydroxybutyl vinylether, cyclohexanedimethanol monovinylether, ethyleneglycol monovinylether, diethyleneglycol monovinylether, triethyleneglycol monovinylether, propyleneglycol monovinylether, dipropyleneglycol monovinylether or tripropyleneglycol monovinylether.

As a third synthesis example of the (A) photopolymerizing compound having a characteristic group represented by general formula (1) above, there may be mentioned addition reaction between a compound having two or more carboxyl groups in the molecule, and a compound having one or more (meth)acryloyl groups and one vinyl ether group in the molecule.

As examples of compounds having two or more carboxyl groups in the molecule there may be mentioned C2-22 aliphatic polycarboxylic acids such as succinic acid, adipic acid, azelaic acid, sebacic acid and decamethylenedicarboxylic acid; aromatic polycarboxylic acids such as phthalic acid, isophthalic acid, terephthalic acid, trimellitic acid and pyromellitic acid; alicyclic polycarboxylic acids such as tetrahydrophthalic acid and hexahydrophthalic acid; and polyester resins, acryl resins and malein-modified polybutadiene resins having two or more carboxyl groups in the molecule.

As examples of compounds having one or more (meth)acryloyl groups and one vinyl ether group in the molecule there may be mentioned the same compounds referred to above for the second synthesis example of the (A) photopolymerizing compound having a characteristic group represented by general formula (1) above.

As a fourth synthesis example of the (A) photopolymerizing compound having a characteristic group represented by general formula (1) above, there may be mentioned addition reaction between a polymer compound comprising a carboxylic acid-containing monomer as the essential copolymerizing component, and a compound having one or more (meth)acryloyl groups and one vinyl ether group in the molecule.

As examples of polymer compounds comprising a carboxylic acid-containing monomer as the essential copolymerizing component there may be mentioned acrylic-based resins, styrene-based resins, epoxy-based resins, amide-based resins, amidoepoxy-based resins, alkyd-based resins and phenol-based resins. Acrylic-based resins are especially preferred. These may be used alone or in combinations of two or more.

The aforementioned acrylic-based resins may be produced by radical polymerization of carboxyl group-containing radical polymerizing monomers and other radical polymerizing monomers. As carboxyl group-containing polymerizing monomers there may be mentioned (meth)acrylic acid, α-bromo(meth)acrylic acid, α-chlor(meth)acrylic acid, β-furyl(meth)acrylic acid, β-styryl(meth)acrylic acid, maleic acid, fumaric acid, cinnamic acid, α-cyanocinnamic acid, itaconic acid, crotonic acid, propiolic acid and the like, but methacrylic acid is particularly preferred.

As examples of the aforementioned other radical polymerizing monomers there may be mentioned polymerizable styrene derivatives such as styrene, vinyltoluene, α-methylstyrene, p-methylstyrene and p-ethylstyrene, acrylamide, acrylonitrile, vinyl alcohol esters such as vinyl n-butyl ether, (meth)acrylic acid alkyl esters, (meth)acrylic acid tetrahydrofurfuryl ester, (meth)acrylic acid dimethylaminoethyl ester, (meth)acrylic acid diethylaminoethyl ester, (meth)acrylic acid glycidyl ester, 2,2,2-trifluoroethyl(meth)acrylate, 2,2,3,3-tetrafluoropropyl(meth)acrylate, and maleic acid monoesters such as monomethyl maleate, monoethyl maleate and monoisopropyl maleate. These may be used alone or in combinations of two or more.

As examples of the aforementioned (meth)acrylic acid alkyl esters there may be mentioned methyl(meth)acrylate, ethyl(meth)acrylate, propyl(meth)acrylate, butyl(meth)acrylate, pentyl(meth)acrylate, hexyl(meth)acrylate, heptyl (meth)acrylate, octyl(meth)acrylate, 2-ethylhexyl(meth) acrylate, and structural isomers thereof. These may be used alone or in combinations of two or more.

As compounds having one or more (meth)acryloyl groups and one vinyl ether group in the molecule there may be mentioned the same compounds referred to above for the second synthesis example of the (A) photopolymerizing compound having a characteristic group represented by general formula (1) above.

As (A) photopolymerizing compounds having a characteristic group with the structure represented by general formula (2) above there may be used compounds synthesized by addition reaction between a compound obtained by substituting chlorine for the hydroxyl group in the carboxyl group of a (meth)acrylic monomer having one carboxyl group in the molecule, and a compound having two or more tertiary hydroxyl groups in the molecule, such as 2,5-dimethyl-2,5-hexanediol.

As a first synthesis example of the (A) photopolymerizing compound having a characteristic group represented by general formula (3) above, there may be mentioned addition reaction between a compound having two or more phenolic or alcoholic hydroxyl groups in the molecule, and a compound having one or more (meth)acryloyl groups and one vinyl ether group in the molecule.

As examples of compounds having two or more phenolic or alcoholic hydroxyl groups in the molecule there may be mentioned hydroquinone, catechol, pyrogallol, 1,2-cyclohexanediol, 1,3-cyclohexanediol, 1,4-cyclohexanediol, 1,4-cyclohexanedimethanol, biphenol, ethylene glycol addition product of biphenol, 2,2'-bis(4-hydroxyphenyl)propane, 2,2'-bis(4-hydroxyethoxyphenyl)propane, 2'-bis(4-hydroxyethoxyphenyl)propane, tri(4-hydroxyphenyl)methane, 1,1',1"-tri(4-hydroxyphenyl)ethane, (2-hydroxy-5-methyl)-1,3-benzenedimethanol, 2,6-bis[(2-hydroxy-5-methylphenyl) methyl]-4-methylphenol, 4,4'-[1-[4-[1-(4-hydroxyphenyl)-1-methylethyl]phenyl]ethylidene]bisphenol and α',α",α'''-tris(4-hydroxyphenyl)-1,3,5-triisopropylzene.

As compounds having one or more (meth)acryloyl groups and one vinyl ether group in the molecule there may be mentioned the same compounds referred to above for the second synthesis example of the (A) photopolymerizing compound having a characteristic group represented by general formula (1) above.

As a second synthesis example of the (A) photopolymerizing compound having a characteristic group represented by general formula (3) above, there may be mentioned addition reaction between a (meth)acrylate monomer having one phenolic or alcoholic group in the molecule, and a compound having one or more (meth)acryloyl groups and one vinyl ether group in the molecule.

As (meth)acrylate monomers having one phenolic or alcoholic group in the molecule there may be mentioned 2-hydroxyethyl(meth)acrylate, 3-hydroxypropyl(meth)acrylate and 4-hydroxybutyl(meth)acrylate.

As compounds having one or more (meth)acryloyl groups and one vinyl ether group in the molecule there may be mentioned the same compounds referred to above for the second synthesis example of the (A) photopolymerizing compound having a characteristic group represented by general formula (1) above.

As a third synthesis example of the (A) photopolymerizing compound having a characteristic group represented by general formula (3) above, there may be mentioned addition reaction between a (meth)acrylate monomer having one phenolic or alcoholic group in the molecule, and a compound having two or more vinyl ether groups in the molecule.

As (meth)acrylate monomers having one phenolic or alcoholic group in the molecule there may be mentioned the same compounds referred to above for the second synthesis example of the (A) photopolymerizing compound having a characteristic group represented by general formula (3) above.

As compounds having two or more vinyl ether groups in the molecule there may be mentioned the same compounds referred to above for the first synthesis example of the (A) photopolymerizing compound having a characteristic group represented by general formula (1) above.

As a fourth synthesis example of the (A) photopolymerizing compound having a characteristic group represented by general formula (3) above, there may be mentioned addition reaction between a polymer compound comprising a phenolic or alcoholic hydroxyl group-containing monomer or a carboxyl group-containing monomer as the essential copolymerizing component, and a compound having one or more (meth) acryloyl groups and one vinyl ether group in the molecule.

As examples of polymer compounds comprising a phenolic hydroxyl group-containing monomer as the essential copolymerizing component there may be mentioned parahydroxystyrene resins and phenolic resins. As examples of polymer compounds comprising an alcoholic hydroxyl group-containing monomer as the essential copolymerizing component there may be mentioned acrylic resins having hydroxyalkyl groups on side chains. Also, as polymer compounds comprising a carboxyl group-containing monomer as the essential copolymerizing component there may be mentioned acrylic resins having carboxyl groups on side chains. These may be used alone or in combinations of two or more.

As the (A) photopolymerizing compound having a characteristic group represented by general formula (4) above there may be used, for example, compounds synthesized by addition reaction between a (meth)acrylic monomer having one isocyanate group in the molecule and a compound having two or more tertiary hydroxyl groups in the molecule.

As an example of a (meth)acrylic monomer with one isocyanate group in the molecule there may be mentioned ethyl methacrylate isocyanate.

As examples of compounds having two or more tertiary hydroxyl groups in the molecule there may be mentioned 2,5-dimethyl-2,5-hexanediol, 2,7-dimethyl-2,7-octanediol, 2,9-dimethyl-2,9-decanediol and 2,11-dimethyl-2,11-dodecanediol.

These examples of the (A) photopolymerizing compound in the photosensitive resin composition of the invention may be used alone or in combinations of two or more.

When a compound synthesized by the fourth synthesis example for the (A) photopolymerizing compound having a characteristic group represented by general formula (1) above is used as the (A) photopolymerizing compound in the photosensitive resin composition of the invention, the weight-average molecular weight (as measured by gel permeation chromatography (GPC) based on a calibration curve for standard polystyrene) is preferably 5,000-300,000. The photopolymerizing compound (A) with a weight-average molecular weight of 5,000-300,000 preferably performs the role as a binder polymer. The weight-average molecular weight of the (A) photopolymerizing compound is more preferably 20,000-300,000 and even more preferably 25,000-150,000. The (D) binder polymer described hereunder may also be used with the (A) photopolymerizing compound.

The photosensitive resin composition of the invention may also contain, in addition to the (A) photopolymerizing compound mentioned above, also other photopolymerizing compounds having at least one ethylenic unsaturated bond in the molecule, in a range which does not inhibit the effect of the invention. As examples of other photopolymerizing compounds there may be mentioned compounds obtained by reacting an $\alpha,\beta$-unsaturated carboxylic acid with a polyhydric alcohol, bisphenol A-type (meth)acrylate compounds, compounds obtained by reacting an $\alpha,\beta$-unsaturated carboxylic acid with a glycidyl group-containing compound, urethane monomers such as (meth)acrylate compounds having urethane bonds in the molecule, nonylphenoxypolyethylene oxyacrylates, phthalic acid-based compounds, (meth) acrylic acid alkyl esters, and the like.

As examples of compounds obtained by reacting an $\alpha,\beta$-unsaturated carboxylic acid with a polyhydric alcohol there may be mentioned polyethyleneglycol di(meth)acrylates having 2-14 ethylene groups, polypropyleneglycol di(meth) acrylates having 2-14 propylene groups, polyethylene-polypropyleneglycol di(meth)acrylates having 2-14 ethylene groups and 2-14 propylene groups, trimethylolpropane di(meth)acrylate, trimethylolpropane tri(meth)acrylate, EO-modified trimethylolpropane tri(meth)acrylate, PO-modified trimethylolpropane tri(meth)acrylate, EO.PO-modified trimethylolpropane tri(meth)acrylate, tetramethylolmethane tri (meth)acrylate, tetramethylolmethane tetra(meth)acrylate, dipentaerythritol penta(meth)acrylate and dipentaerythritol hexa(meth)acrylate. These may be used alone or in combinations of two or more. Here, "EO" refers to ethylene oxide, and an EO-modified compound is one that has an ethylene oxide unit block structure. "PO" refers to propylene oxide, and a PO-modified compound is one that has a propylene oxide unit block structure.

As the aforementioned bisphenol A-type (meth)acrylate compounds there may be mentioned 2,2-bis(4-((meth)acryloxypolyethoxy)phenyl)propane, 2,2-bis(4-((meth)acryloxypolypropoxy)phenyl)propane, 2,2-bis(4-((meth)acryloxypolybutoxy)phenyl)propane and 2,2-bis(4-((meth) acryloxypolyethoxypolypropoxy)phenyl)propane. As examples of the aforementioned 2,2-bis(4-((meth)acryloxypolyethoxy)phenyl)propane compounds there may be mentioned 2,2-bis(4-((meth)acryloxydiethoxy)phenyl)propane, 2,2-bis(4-((meth)acryloxytriethoxy)phenyl)propane, 2,2-bis (4-((meth)acryloxytetraethoxy)phenyl)propane, 2,2-bis(4-((meth)acryloxypentaethoxy)phenyl)propane, 2,2-bis(4-((meth)acryloxyhexaethoxy)phenyl)propane, 2,2-bis(4-((meth)acryloxyheptaethoxy)phenyl)propane, 2,2-bis(4-((meth)acryloxyoctaethoxy)phenyl)propane, 2,2-bis(4-((meth)acryloxynonaethoxy)phenyl)propane, 2,2-bis(4-((meth)acryloxydecaethoxy)phenyl)propane, 2,2-bis(4-((meth)acryloxyundecaethoxy)phenyl)propane, 2,2-bis(4-((meth)acryloxydodecaethoxy)phenyl)propane, 2,2-bis(4-((meth)acryloxytridecaethoxy)phenyl)propane, 2,2-bis(4-((meth)acryloxytetradecaethoxy)phenyl)propane, 2,2-bis(4-((meth)acryloxypentadecaethoxy)phenyl)propane and 2,2-bis(4-((meth)acryloxyhexadecaethoxy)phenyl)propane, among which 2,2-bis(4-(methacryloxypentaethoxy)phenyl) propane is commercially available as BPE-500 (trade name of Shin-Nakamura Chemical Co., Ltd.), and 2,2-bis(4-(methacryloxypentadecaethoxy)phenyl)propane is commercially available as BPE-1300 (trade name of Shin-Nakamura Chemical Co., Ltd.). The number of ethylene oxide groups per molecule of the 2,2-bis(4-((meth)acryloxypolyethoxy) phenyl)propane is preferably 4-20 and more preferably 8-15.

As examples of the aforementioned (meth)acrylate compounds having a urethane bond in the molecule there may be mentioned addition products of (meth)acrylic monomers having OH groups at the $\beta$ position and diisocyanate compounds (isophoronediisocyanate, 2,6-toluenediisocyanate, 2,4-toluenediisocyanate, 1,6-hexamethylenediisocyanate, etc.), tris((meth)acryloxytetraethyleneglycol isocyanate) hexamethylene isocyanurate, EO-modified urethane di(meth)acrylate, and EO.PO-modified urethane di(meth)acrylate. As an example of an EO-modified urethane di(meth)acrylate there may be mentioned UA-11 (trade name of Shin-Nakamura Chemical Co., Ltd.). As an example of an EO.PO-modified urethane di(meth)acrylate there may be mentioned UA-13 (trade name of Shin-Nakamura Chemical Co., Ltd.).

As examples of the aforementioned nonylphenoxypolyethyleneoxy acrylates there may be mentioned nonylphenoxytetraethyleneoxy acrylate, nonylphenoxypentaethyleneoxy acrylate, nonylphenoxyhexaethyleneoxy acrylate, nonylphenoxyheptaethyleneoxy acrylate, nonylphenoxyoctaethyleneoxy acrylate, nonylphenoxynonaethyleneoxy acrylate, nonylphenoxydecaethyleneoxy acrylate and nonylphenoxyundecaethyleneoxy acrylate.

As the aforementioned phthalic acid-based compounds there may be mentioned γ-chloro-β-hydroxypropyl-β'-(meth)acryloyloxyethyl-o-phthalate and β-hydroxyalkyl-β'-(meth)acryloloxyalkyl-o-phthalate.

The (B) photopolymerization initiator will now be explained.

As examples of the (B) photopolymerization initiator there may be mentioned aromatic ketones including benzophenone, N,N'-tetraalkyl-4,4'-diaminobenzophenones such as N,N'-tetramethyl-4,4'-diaminobenzophenone (Michler's ketone), 2-benzyl-2-dimethylamino-1-(4-morphorinophenyl)-butanone-1,2-methyl-1-[4-(methylthio)phenyl]-2-morpholino-propanone-1 and the like, quinones such as alkylanthraquinones, benzoin ether compounds such as benzoin alkyl ethers, benzoin, benzoin compounds such as alkylbenzoins, benzyl derivatives such as benzyldimethyl ketal, 2,4,5-triarylimidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer and 2-(p-methoxyphenyl)-4,5-diphenylimidazole dimer, acridine derivatives such as 9-phenylacridine and 1,7-bis(9,9'-acridinyl)heptane, N-phenylglycine, N-phenylglycine derivatives, coumarin-based compounds, and the like. Substituents on two of the aryl groups of 2,4,5-triarylimidazole may be identical to yield a symmetrical compound, or they may be different to yield an asymmetrical compound. These compounds may be used alone or in combinations of two or more.

The (C) acid generator will now be explained.

As examples for the (C) acid generator there may be mentioned onium salts such as diazonium salts, iodonium salts, bromonium salts, chloronium salts, sulfonium salts, selenonium salts, pyrylium salts, thiapyrilium salts and pyridinium salts; halogenated compounds such as tris(trihalomethyl)-s-triazine and its derivatives; sulfonic acid 2-nitrobenzyl ester; iminosulfonates; 1-oxo-2-diazonaphthoquinone-4-sulfonate derivatives; N-hydroxyimidesulfonate; tri(methanesulfonyloxy)benzene derivatives; bissulfonyldiazomethanes; sulfonylcarbonylalkanes; sulfonylcarbonyldiazomethanes; disulfone compounds, and the like.

The (D) binder polymer will now be explained.

As examples for the (D) binder polymer there may be mentioned acrylic-based resins, styrene-based resins, epoxy-based resins, amide-based resins, amidoepoxy-based resins, alkyd-based resins and phenol-based resins. Acrylic-based resins are preferred from the standpoint of alkali developing properties. These resins may be used alone or in combinations of two or more.

The aforementioned binder polymer may be produced, for example, by radical polymerization of a polymerizing monomer. As examples of polymerizing monomers there may be mentioned polymerizable styrene derivatives such as styrene, vinyltoluene, α-methylstyrene, p-methylstyrene and p-ethylstyrene, acrylamide, acrylonitrile, vinyl alcohol esters such as vinyl-n-butyl ether, (meth)acrylic acid alkyl esters, (meth)acrylic acid tetrahydrofurfuryl ester, (meth)acrylic acid dimethylaminoethyl ester, (meth)acrylic acid diethylaminoethyl ester, (meth)acrylic acid glycidyl ester, 2,2,2-trifluoroethyl (meth)acrylate, 2,2,3,3-tetrafluoropropyl(meth)acrylate, (meth)acrylic acid, α-bromo(meth)acrylic acid, α-chlor (meth)acrylic acid, β-furyl(meth)acrylic acid, β-styryl(meth)acrylic acid, maleic acid, maleic anhydride, maleic acid monoesters such as monomethyl maleate, monoethyl maleate and monoisopropyl maleate, fumaric acid, cinnamic acid, α-cyanocinnamic acid, itaconic acid, crotonic acid, propiolic acid, and the like. These may be used alone or in combinations of two or more.

As examples of the aforementioned (meth)acrylic acid alkyl esters there may be mentioned methyl(meth)acrylate, ethyl(meth)acrylate, propyl(meth)acrylate, butyl(meth)acrylate, pentyl(meth)acrylate, hexyl(meth)acrylate, heptyl(meth)acrylate, octyl(meth)acrylate, 2-ethylhexyl(meth)acrylate, and structural isomers thereof. These may be used alone or in combinations of two or more.

The binder polymer preferably contains a carboxyl group from the standpoint of alkali developing properties, and for example, it may be produced by radical polymerization of a carboxyl group-containing polymerizing monomer and another polymerizing monomer. Methacrylic acid is a preferred carboxyl group-containing polymerizing monomer.

The binder polymer also preferably contains styrene and/or a styrene-derivative as the polymerizing monomer, from the standpoint of adhesion and removability. If styrene or a styrene derivative is present as the polymerizing monomer, the content is preferably 3-30 mass %, more preferably 4-28 mass % and even more preferably 5-27 mass % from the standpoint of achieving satisfactory adhesion and removability. If the content is less than 3 mass % the adhesion will tend to be inferior, and if it is greater than 30 mass % the removal time (release start time) will tend to be lengthened.

The acid value of the binder polymer is preferably 10-300 mg KOH/g, more preferably 30-200 mg KOH/g and even more preferably 45-150 mg KOH/g. If the acid value is less than 10 mg KOH/g the developing time will tend to be lengthened, and if it is greater than 300 mg KOH/g the developing solution resistance of the photocured resist will tend to be reduced. When solvent development is carried out as the developing step, the carboxyl group-containing polymerizing monomer is preferably adjusted to a small amount.

The weight-average molecular weight of the binder polymer (as measured by gel permeation chromatography (GPC) based on a calibration curve for standard polystyrene) is preferably 5,000-300,000, more preferably 20,000-300,000 and most preferably 25,000-150,000. If the weight-average molecular weight is less than 5,000 the developing solution resistance will tend to be lowered, and if it exceeds 300,000 the developing time will tend to be lengthened.

The binder polymer may also include photosensitive groups if necessary.

Such binder polymers may be used alone or in combinations of two or more. As examples of binder polymers of which two or more types are used in combination there may be mentioned two or more different binder polymers composed of different polymerizing monomers, two or more different binder polymers with different weight-average molecular weights, and two or more different binder polymers with different dispersities. There may also be used a polymer having a multimode molecular weight distribution such as described in Japanese Unexamined Patent Publication HEI No. 11-327137.

When the photosensitive resin composition of the invention contains the (D) binder polymer, the content of the (D) binder polymer in the photosensitive resin composition is preferably 40-80 parts by mass and more preferably 45-70 parts by mass based on 100 parts by mass as the total of the (A) photopolymerizing compound and (D) binder polymer. If the content is below the aforementioned lower limit the photocured product will tend to be brittle and when used as a photosensitive element it will tend to exhibit inferior coatability, while if the content is above the aforementioned upper limit, the photosensitivity will be insufficient and the removability of the photocured product will tend to be reduced.

The content of the (B) photopolymerization initiator is preferably 0.1-20 parts by mass and more preferably 0.2-10 parts by mass with respect to 100 parts by mass as the total of the (A) photopolymerizing compound and (D) binder polymer. If the content is below the aforementioned lower limit the photosensitivity will tend to be insufficient, while if it is above the aforementioned upper limit absorption will be increased on the surface of the photosensitive resin composition during exposure, tending to result in insufficient photocuring in the interior.

When the photosensitive resin composition of the invention comprises (C) an acid generator, the content of the (C) acid generator in the photosensitive resin composition is preferably no greater than 30 parts by mass and more preferably no greater than 20 parts by mass with respect to 100 parts by mass as the total of the (A) photopolymerizing compound and (D) binder polymer. If the content is greater than this limit, the storage stability will tend to be reduced. A photosensitive resin composition of the invention including the (C) acid generator at a content below this limit will tend to have a lower temperature for breakage of the bonds of the characteristic group.

If necessary, the photosensitive resin composition of the invention may also contain a dye such as malachite green, a photo coloring agent such as tribromophenylsulfone or leucocrystal violet, a thermal coloring inhibitor, a plasticizer such as p-toluenesulfonamide, a pigment, a filler, a defoaming agent, a flame retardant, a stabilizer, a tackifier, a leveling agent, an antioxidant, an aroma, an imaging agent, a crosslinking agent, or the like. These may be used alone or in combinations of two or more.

The photosensitive resin composition may, if necessary, be dissolved in a solvent such as methanol, ethanol, acetone, methyl ethyl ketone, methylcellosolve, ethylcellosolve, toluene, N,N-dimethylformamide or propyleneglycol monomethylether, or a mixture of these solvents, and coated as a solution with a solid portion of about 30-60 mass %.

The photosensitive resin composition is preferably applied as a liquid resist onto a metal surface such as copper, copper-based alloy, iron, iron-based alloy or the like, without any particular restriction, and then dried and covered with a protective film if necessary, or used in the form of a photosensitive element as described hereunder.

The thickness of the photosensitive resin composition layer for use in this manner will differ depending on the purpose, but is preferably about 1-100 µm and more preferably 1-50 µm. A thickness of less than 1 µm will tend to hamper industrial coating, while a thickness of greater than 100 µm will tend to reduce the effect of the invention compared to a thickness within the aforementioned range, and will tend to reduce the adhesive force and resolution.

(Photosensitive Element)

FIG. 1 is a schematic cross-sectional diagram showing a preferred embodiment of a photosensitive element according to the invention. The photosensitive element 1 shown in FIG. 1 is provided with a support film 10 and a photosensitive resin composition layer 14 made of a photosensitive resin composition of the invention, formed on the support film 10.

The support film 10 may be, for example, a polymer film such as polyethylene terephthalate, polypropylene, polyethylene or polyester.

The thickness of the polymer film is preferably 1-100 µm, more preferably 5-60 µm, even more preferably 8-50 µm and most preferably 10-40 µm. A thickness of less than 1 µm will result in cracking during release of the support prior to development, while a thickness of greater than 100 µm will tend to reduce the resolution.

The photosensitive resin composition layer 14 can be obtained by dissolving the photosensitive resin composition in a solvent to make a coating solution, and applying and drying it on the support film. The application may be accomplished by a publicly known process using a roll coater, comma coater, gravure coater, air knife coater, die coater, bar coater or the like. The drying may be carried out at 70-150° C. for about 5-30 minutes, to an extent that the bonds of the (A) polymerizing compound are not broken. The residual organic solvent content of the photosensitive resin composition layer is preferably no greater than 2 mass %, from the standpoint of preventing diffusion of the organic solvent in later steps.

For a photosensitive element of the invention, the photosensitive resin composition layer 14 may be laminated on both sides with one polymer film as the support film 10 for the photosensitive resin composition layer 14, and another as a photosensitive resin composition protective film (not shown). Here, the protective film covers side F1 which is opposite the support film 10 of the photosensitive resin composition layer 14. The protective film is preferably one such that the adhesive force between the photosensitive resin composition layer 14 and the protective film is less than the adhesive force between the photosensitive resin composition layer 14 and support film 10, and preferably is a film with minimal fisheyes.

The thickness of the protective film is preferably 5-50 µm, more preferably 10-40 µm and most preferably 15-30 µm. A thickness of less than 5 µm will tend to result in tearing of the protective film during lamination, while a thickness of greater than 50 µm will tend to economically disadvantageous.

The photosensitive element 1 may also comprise, in addition to the photosensitive resin composition layer 14, support film 10 and protective film, also an interlayer or protective layer such as a cushion layer, adhesive layer, photoabsorbing layer or gas barrier layer.

The photosensitive element 1 is stored, for example, directly or with a protective film further laminated on the other side of the photosensitive resin composition prior to coiling up onto a cylindrical core into a roll form. It is preferably coiled with the support film on the outermost side. The edges of the photosensitive element coiled into a roll are preferably provided with an edge separator from the standpoint of edge protection, and a moisture-resistant edge separator from the standpoint of preventing edge fusion. The packing method preferably involves wrapping with a low-moisture-permeable black sheet.

The material for the core may be plastic such as, for example, a polyethylene resin, polypropylene resin, polystyrene resin, polyvinyl chloride resin, ABS resin (acrylonitrile-butadiene-styrene copolymer) or the like.

(Resist Pattern Forming Method)

The resist pattern forming method of the invention is a method in which a photosensitive resin composition layer composed of the aforementioned photosensitive resin composition or a photosensitive resin composition layer in the aforementioned photosensitive element is laminated on a circuit-forming board, active light rays are irradiated on prescribed areas of the photosensitive resin composition layer for photocuring of the exposed sections, and then the non-exposed sections are removed to form a resist pattern.

The method for laminating the photosensitive resin composition layer made of the photosensitive resin composition may be a method wherein the photosensitive resin composition is dissolved in a solvent to prepare a coating solution which is then applied and dried on a circuit-forming board. The solvent, application method and drying conditions employed may be the same as for formation of a photosensitive resin composition layer in a photosensitive element.

When a protective film is present, the method of laminating the photosensitive resin composition layer using a photosensitive element may be a lamination method in which the protective film is first removed, and then the photosensitive resin composition layer is contact bonded onto the circuit-forming board at a pressure of about 0.1-1.0 MPa (about 1-10 kgf/cm$^2$) while heating at about 70-130° C., or alternatively lamination may be carried out under reduced pressure. The laminating surface of the circuit-forming board is an ordinary metal surface but is not particularly restricted.

The photosensitive resin composition layer on which lamination has been completed in the manner described above is irradiated with active light rays onto prescribed sections (a prescribed image form) through a mask pattern (pattern exposure), for photocuring of the exposed sections. When the support film on the photosensitive resin composition layer is transparent, the active light rays may be irradiated through the support film, but when the support film is opaque, it must be removed before irradiating the active light rays. The light source for the active light rays may be a publicly known light source which efficiently emits ultraviolet rays or visible light rays, such as a carbon arc lamp, mercury-vapor arc lamp, high-pressure mercury lamp or xenon lamp. There may also be employed direct writing exposure methods that do not need a mask pattern, such as laser direct writing exposure methods or DLP (Digital Light Processing) exposure methods.

When the support remains on the photosensitive resin composition layer after pattern exposure, the support is then removed off and the unexposed sections are removed by wet development with an aqueous alkali solution, aqueous developing solution or organic solvent, or by dry development, to form a resist pattern.

The aforementioned aqueous alkali solution may be, for example, a 0.1-5 wt % sodium carbonate dilute solution, a 0.1-5 wt % potassium carbonate dilute solution or a 0.1-5 wt % sodium hydroxide dilute solution. The pH of the aqueous alkali solution is preferably in the range of 9-11, and the temperature is adjusted for the developing properties of the photosensitive resin composition. The aqueous alkali solution may also contain a surfactant, defoaming agent, organic solvent and the like. As examples of developing systems there may be mentioned dip systems, spray systems, brushing systems and slapping systems.

As post-development treatment if necessary, the resist pattern may be further cured by exposure at about 0.2-10 J/cm$^2$.

(Printed Circuit Board Manufacturing Process)

The printed circuit board manufacturing process of the invention is a process comprising a circuit-forming step in which a circuit-forming board having a resist pattern formed thereon by the aforementioned resist pattern forming method is subjected to etching or plating, and a removal step in which the resist pattern is removed from the circuit-forming board either during or after heating to 130-250° C.

The circuit-forming step may be carried out by using the developed resist pattern as a mask for etching or plating of the surface of the circuit-forming board by a publicly known process.

Examples of plating include copper plating, solder plating, nickel plating and gold plating. The metal surface may be etched by using, for example, a copper(II) chloride solution, an iron(II) chloride solution or an alkali etching solution.

Removal of the resist pattern in the removal step may be carried out after or while heating the resist pattern. Heating of the resist pattern must be carried out under temperature conditions of 130-250° C., depending on the (A) photopolymerizing compound or photosensitive resin composition used, but is preferably carried out under temperature conditions of 140-220° C. and is more preferably carried out under temperature conditions of 150-200° C. If the heating temperature is below 130° C., the bonds of the characteristic group will not break sufficiently and removal of the resist pattern will be unsatisfactory. If the heating temperature is above 250° C., the formed circuit may suffer thermal damage and operation safety may be reduced.

The heating time is preferably between 30 seconds and 1 hour, more preferably between 1 and 30 minutes and most preferably between 5 and 20 minutes, from the standpoint of adequately breaking the bonds of the characteristic groups for reliable removal of the resist pattern.

When the photosensitive resin composition includes an acid generator, the heating may be preceded by irradiation with active light rays. The active light ray source may be a publicly known light source which efficiently emits ultraviolet rays or visible light rays, such as a carbon arc lamp, mercury-vapor arc lamp, high-pressure mercury lamp or xenon lamp.

Removal of the resist pattern in the removal step may be accomplished using an aqueous alkali solution, optionally containing an organic amine or organic solvent, such as a 0.1-10 wt % aqueous sodium carbonate solution, a 0.1-10 wt % aqueous potassium carbonate solution, a 0.1-10 wt % aqueous sodium hydroxide solution or a 0.1-10 wt % aqueous potassium hydroxide solution. The removal system may be, for example, a dipping system or spraying system. The removal step may also be carried out under pressure.

(Photocured Product Removal Method)

The photocured product removal method of the invention is a method wherein a photocured product, obtained by laminating a photosensitive resin composition layer composed of a photosensitive resin composition of the invention or the photosensitive resin composition layer of a photosensitive element of the invention onto a support board and exposing it to active light rays for photocuring of the photosensitive resin composition layer, is removed from the support board either during or after heating to 130-250° C. This removal method can also be applied to fields other than manufacture of printed circuit boards and the like. The support board is not particularly restricted so long as it can be laminated with the photosensitive resin composition layer.

The method used for removal of a photocured product laminated on a support board may be the same method as for removal of a resist pattern in the removal step of the process for manufacturing a printed circuit board described above, and the heating temperature or heating time of the photocured product, as well as the solution and system used for removal, may also be the same.

EXAMPLES

The present invention will now be explained in greater detail by examples and comparative examples, with the understanding that the invention is not limited to the examples.

Synthesis of (A) Photopolymerizing Compound

Synthesis of (A) Photopolymerizing Compound A-1

After placing 861 parts by mass of methacrylic acid, 791 parts by mass of diethyleneglycol divinylether and 5.3 parts by mass of 2-ethylhexyl phosphate in a sample bottle, the mixture was stirred with a mix rotor for 2 days at room temperature to obtain photopolymerizing compound A-1. NMR spectral analysis of the structure of the compound confirmed the presence of two methacryloyl groups per molecule, thereby identifying it as the compound represented by the following general formula (12).

[Chemical Formula 12]

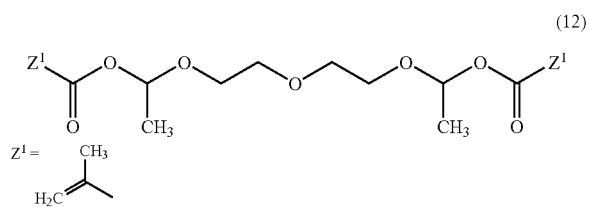

(12)

Synthesis of (A) Photopolymerizing Compound A-2

After placing 721 parts by mass of acrylic acid, 791 parts by mass of diethyleneglycol divinylether and 5.3 parts by mass of 2-ethylhexyl phosphate in a sample bottle, the mixture was stirred with a mix rotor for 2 days at room temperature to obtain photopolymerizing compound A-2. NMR spectral analysis of the structure of the compound confirmed the presence of two acryloyl groups per molecule, thereby identifying it as the compound represented by the following general formula (13).

[Chemical Formula 13]

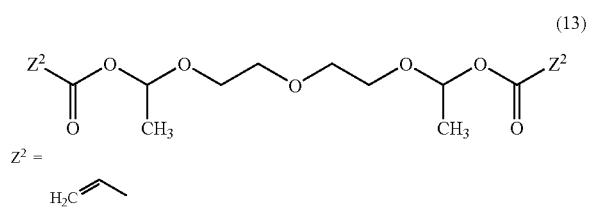

(13)

Synthesis of (A) Photopolymerizing Compound A-3

After placing 2162 parts by mass of 2-acryloyloxyethyl succinate, 791 parts by mass of diethyleneglycol divinylether and 5.3 parts by mass of 2-ethylhexyl phosphate in a sample bottle, the mixture was stirred with a mix rotor for 2 days at room temperature to obtain photopolymerizing compound A-3. NMR spectral analysis of the structure of the compound confirmed the presence of two acryloyl groups per molecule, thereby identifying it as the compound represented by the following general formula (14).

[Chemical Formula 14]

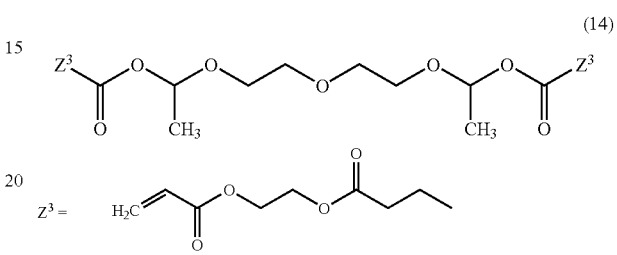

(14)

Synthesis of (A) Photopolymerizing Compound A-4

After placing 2703 parts by mass of 2-acryloyloxyethyl hexahydrophthalate, 791 parts by mass of diethyleneglycol divinylether and 5.3 parts by mass of 2-ethylhexyl phosphate in a sample bottle, the mixture was stirred with a mix rotor for 2 days at room temperature to obtain photopolymerizing compound A-4. NMR spectral analysis of the structure of the compound confirmed the presence of two acryloyl groups per molecule, thereby identifying it as the compound represented by the following general formula (15).

[Chemical Formula 15]

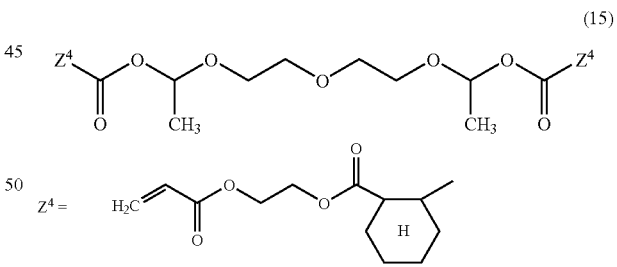

(15)

Synthesis of (A) Photopolymerizing Compound A-5

After placing 2783 parts by mass of 2-acryloyloxypropyl phthalate, 791 parts by mass of diethyleneglycol divinylether and 5.3 parts by mass of 2-ethylhexyl phosphate in a sample bottle, the mixture was stirred with a mix rotor for 2 days at room temperature to obtain photopolymerizing compound A-5. NMR spectral analysis of the structure of the compound confirmed the presence of two acryloyl groups per molecule, thereby identifying it as the compound represented by the following general formula (16).

[Chemical Formula 16]

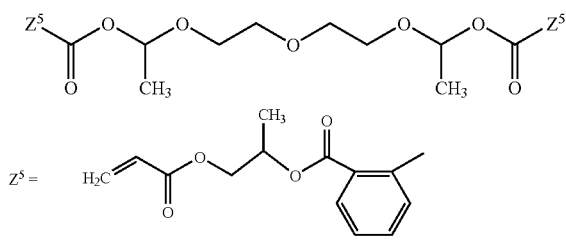

(16)

[Chemical Formula 17]

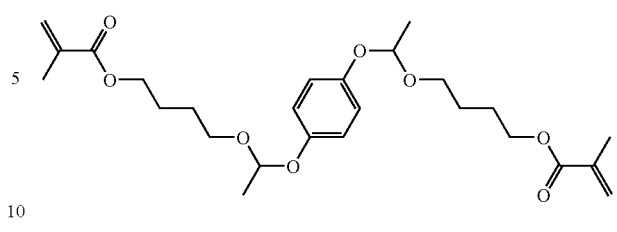

(17)

Synthesis of (A) Photopolymerizing Compound A-6

After placing 55 mmol of hydroquinone, 100 mmol of 4-vinyloxybutyl methacrylate, 0.25 mmol of pyridinium p-toluenesulfonate and 20 g of dimethylformamide in a sample bottle, the mixture was stirred with a mix rotor for 2 days at room temperature. It was then transferred to a separatory funnel, 100 g of ethyl acetate was added and the mixture was washed with 1% aqueous sodium hydrogencarbonate. The oily layer was then separated, and sodium sulfate was added to the oily layer for drying. The sodium sulfate was filtered out and the solvent was distilled off under reduced pressure to obtain photopolymerizing compound A-6. NMR spectral analysis of the structure of the compound confirmed the presence of two methacryloyl groups per molecule, thereby identifying it as the compound represented by the following general formula (17).

Synthesis of (A) Photopolymerizing Compound A-7

After placing 55 mmol of bisphenol A, 100 mmol of 2-(2'-vinyloxyethoxy)ethyl methacrylate (product of Nihon Shokubai Co., Ltd.), 0.3 mmol of pyridinium p-toluenesulfonate and 30 g of dimethylformamide in a sample bottle, the mixture was stirred with a mix rotor for 2 days at room temperature. It was then transferred to a separatory funnel, 100 g of ethyl acetate was added and the mixture was washed with 1% aqueous sodium hydrogencarbonate. The oily layer was then separated, and sodium sulfate was added to the oily layer for drying. The sodium sulfate was filtered out and the solvent was distilled off under reduced pressure to obtain photopolymerizing compound A-7. NMR spectral analysis of the structure of the compound confirmed the presence of two methacryloyl groups per molecule, thereby identifying it as the compound represented by the following general formula (18).

[Chemical Formula 18]

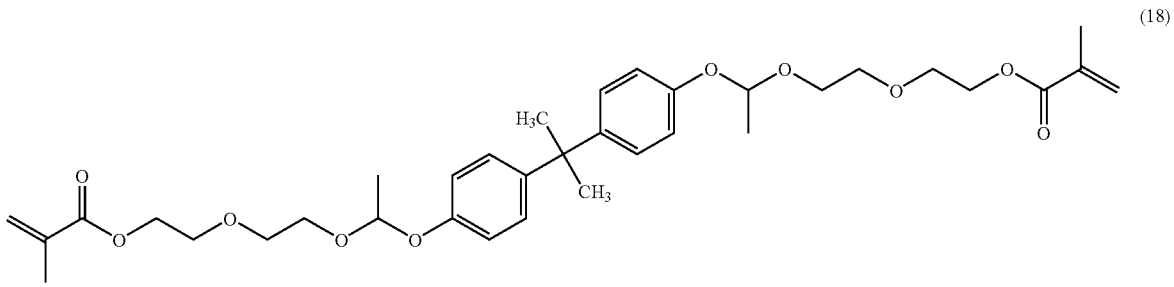

(18)

Synthesis of (A) Photopolymerizing Compound A-8

After placing 55 mmol of hydroquinone, 100 mmol of 2-(2'-vinyloxyethoxy)ethyl methacrylate (product of Nihon Shokubai Co., Ltd.), 0.25 mmol of pyridinium p-toluenesulfonate and 20 g of dimethylformamide in a sample bottle, the mixture was stirred with a mix rotor for 2 days at room temperature. It was then transferred to a separatory funnel, 100 g of ethyl acetate was added and the mixture was washed with 1% aqueous sodium hydrogencarbonate. The oily layer was then separated, and sodium sulfate was added to the oily layer for drying. The sodium sulfate was filtered out and the solvent was distilled off under reduced pressure to obtain photopolymerizing compound A-8. NMR spectral analysis of the structure of the compound confirmed the presence of two methacryloyl groups per molecule, thereby identifying it as the compound represented by the following general formula (19).

[Chemical Formula 19]

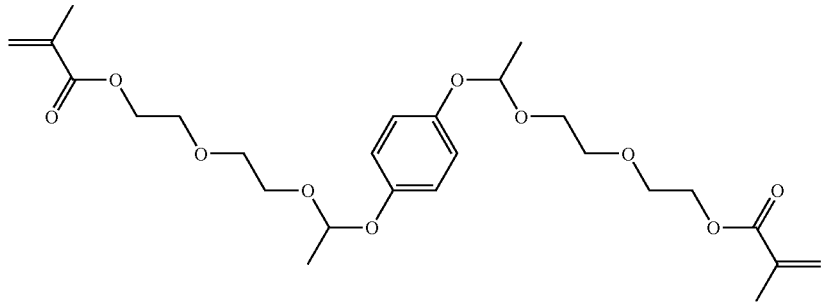

(19)

Synthesis of (A) Photopolymerizing Compound A-9

After placing 55 mmol of 1,4-cyclohexanedimethanol, 100 mmol of 2-(2'-vinyloxyethoxy)ethyl methacrylate (product of Nihon Shokubai Co., Ltd.), 0.25 mmol of pyridinium p-toluenesulfonate and 20 g of dimethylformamide in a sample bottle, the mixture was stirred with a mix rotor for 2 days at room temperature. It was then transferred to a separatory funnel, 100 g of ethyl acetate was added and the mixture was washed with 1% aqueous sodium hydrogencarbonate. The oily layer was then separated, and sodium sulfate was added to the oily layer for drying. The sodium sulfate was filtered out and the solvent was distilled off under reduced pressure to obtain photopolymerizing compound A-9. NMR spectral analysis of the structure of the compound confirmed the presence of two methacryloyl groups per molecule, thereby identifying it as the compound represented by the following general formula (20).

[Chemical Formula 20]

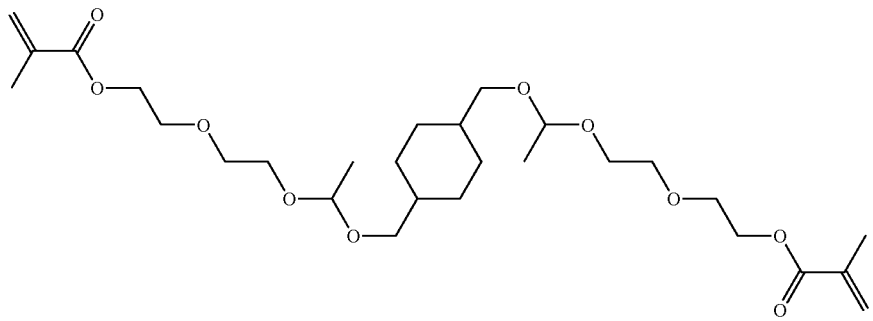

(20)

Synthesis of (A) Photopolymerizing Compound A-10

After placing 45 mmol of triphenolmethane, 120 mmol of 2-(2'-vinyloxyethoxy)ethyl methacrylate (product of Nihon Shokubai Co., Ltd.), 0.5 mmol of pyridinium p-toluenesulfonate and 30 g of dimethylformamide in a sample bottle, the mixture was stirred with a mix rotor for 2 days at room temperature. It was then transferred to a separatory funnel, 100 g of ethyl acetate was added and the mixture was washed with 1% aqueous sodium hydrogencarbonate. The oily layer was then separated, and sodium sulfate was added to the oily layer for drying. The sodium sulfate was filtered out and the solvent was distilled off under reduced pressure to obtain photopolymerizing compound A-10. NMR spectral analysis of the structure of the compound confirmed the presence of three methacryloyl groups per molecule, thereby identifying it as the compound represented by the following general formula (21).

[Chemical Formula 21]

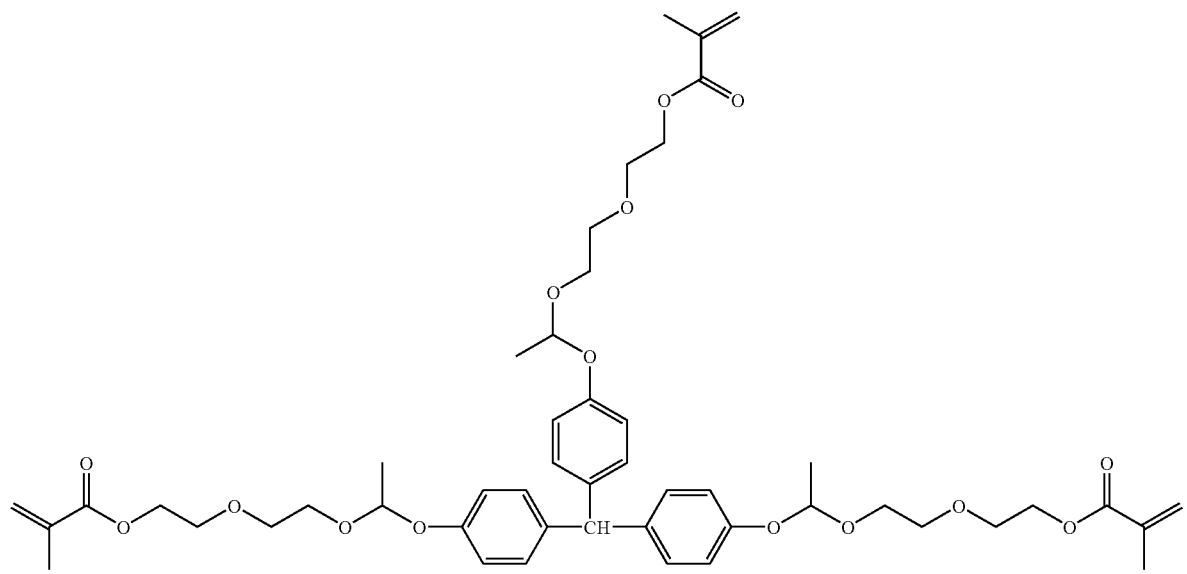

(21)

Synthesis of (A) Photopolymerizing Compound A-11

After placing 60 mmol of 2,5-dimethyl-2,5-hexanediol (product of Tokyo Chemical Industries Co., Ltd.), 55 mmol of 2-methacryloyloxyethyl isocyanate (product of Showa Denko Co., Ltd.) and 20 g of dimethylformamide in a sample bottle, the mixture was stirred with a mix rotor for 2 days at room temperature. It was then transferred to a separatory funnel, 100 g of ethyl acetate was added and the mixture was washed with 1% aqueous sodium hydrogencarbonate. The oily layer was then separated, and sodium sulfate was added to the oily layer for drying. The sodium sulfate was filtered out and the solvent was distilled off under reduced pressure to obtain photopolymerizing compound A-11. NMR spectral analysis of the structure of the compound confirmed the presence of two methacryloyl groups per molecule, thereby identifying it as the compound represented by the following general formula (22).

[Chemical Formula 22]

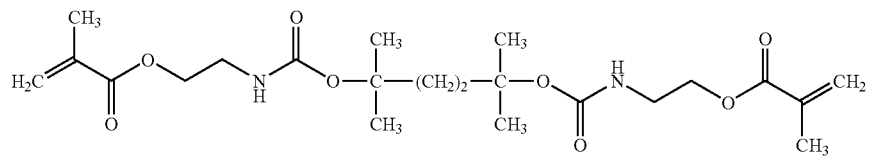

(22)

Synthesis of (A) Photopolymerizing Compound
A-12

After placing a solution of 2870 parts by mass of methacrylic acid/methyl methacrylate/styrene copolymer (mass ratio: 40/35/25, weight-average molecular weight: 55,000) dissolved in 3507 parts by mass of a methoxyethanol/toluene mixed solvent (mass ratio: 3/2), 921 parts by mass of 4-vinyloxybutyl methacrylate (product of Koyo Chemical Industries Co., Ltd.) and 5.3 parts by mass of 2-ethylhexyl phosphate in a sample bottle, the mixture was stirred with a mix rotor for 1 day at 70° C. to obtain photopolymerizing compound A-12. Acid titration of the compound confirmed that at least 95% of the 4-vinyloxybutyl methacrylate had been added to methacrylic acid in the methacrylic acid/methyl methacrylate/styrene copolymer.

Measurement of Intramolecular Bond-Breaking Temperature

The (A) photopolymerizing compounds A-1 to A-12 synthesized as described above as photopolymerizing compounds, and tetraethyleneglycol dimethacrylate (trade name: 4G by Shin-Nakamura Chemical Co., Ltd.) for comparison were each prepared to 100 parts by mass. A solution of 1 part by mass of 2-benzyl-2-dimethylamino-1-(4-morpholinophenyl)-butanone-1 (trade name: Irg-369, product of Ciba Specialty Chemicals) dissolved in 20 parts by mass of acetone was added to each photopolymerizing compound, to prepare 13 different coating solutions. Each coating solution was applied onto a 5-inch dummy silicon wafer using a spin coater, and then dried at 100° C. for 5 minutes to remove the acetone, thereby forming a coating. The obtained coating was covered with a 20 μm-thick PET film, and subjected to light exposure from the top of the PET film using a UX-1000SM-XJ01 Proximity exposure apparatus (product of Ushio Denki Co., Ltd.) at a total wavelength exposure dose of 3 J/cm², to fabricate film-like samples 1-13 each with a thickness of approximately 40 μm.

A 10 mg section of each of the obtained film-like samples 1-13 was taken and used for measurement of the exothermic peak temperature by DSC and the weight loss starting temperature by TG-DTA. Measurement of the exothermic peak temperature by DSC was conducted using a DSC6200 (Seiko Instruments) as the measuring device, in a nitrogen atmosphere with a measuring temperature range of 50-250° C. at a temperature elevating rate of 10° C./min. Measurement of the weight loss starting temperature by TG-DTA was conducted using a TG/DTA6200 (Seiko Instruments) as the measuring device, in a nitrogen atmosphere with a measuring temperature range of 50-350° C. at a temperature elevating rate of 10° C./min. The intramolecular bond-breaking temperature of each photopolymerizing compound is represented as the exothermic peak temperature by DSC and the weight loss starting temperature by TG-DTA. The measurement results are shown in Table 1. The (A) photopolymerizing compound of the invention may have either one of the exothermic peak temperature by DSC or weight loss starting temperature by TG-DTA in the range of 130-250° C., but preferably both the exothermic peak temperature by DSC and weight loss starting temperature by TG-DTA are in the range of 130-250° C.

TABLE 1

| | | Film-like samples | | | | | | | | | | | | |
|---|---|---|---|---|---|---|---|---|---|---|---|---|---|---|
| | | 1 | 2 | 3 | 4 | 5 | 6 | 7 | 8 | 9 | 10 | 11 | 12 | 13 |
| Photopolymerizing compound (pts. by mass) | A-1 | 100 | — | — | — | — | — | — | — | — | — | — | — | — |
| | A-2 | — | 100 | — | — | — | — | — | — | — | — | — | — | — |
| | A-3 | — | — | 100 | — | — | — | — | — | — | — | — | — | — |
| | A-4 | — | — | — | 100 | — | — | — | — | — | — | — | — | — |
| | A-5 | — | — | — | — | 100 | — | — | — | — | — | — | — | — |
| | A-6 | — | — | — | — | — | 100 | — | — | — | — | — | — | — |
| | A-7 | — | — | — | — | — | — | 100 | — | — | — | — | — | — |
| | A-8 | — | — | — | — | — | — | — | 100 | — | — | — | — | — |
| | A-9 | — | — | — | — | — | — | — | — | 100 | — | — | — | — |
| | A-10 | — | — | — | — | — | — | — | — | — | 100 | — | — | — |
| | A-11 | — | — | — | — | — | — | — | — | — | — | 100 | — | — |
| | A-12 | — | — | — | — | — | — | — | — | — | — | — | 100 | — |
| | 4G | — | — | — | — | — | — | — | — | — | — | — | — | 100 |
| Photopolymerization initiator (pts. by mass) | Irg-369 | 1 | 1 | 1 | 1 | 1 | 1 | 1 | 1 | 1 | 1 | 1 | 1 | 1 |
| Weight loss starting temperature (° C.) | | 230 | 235 | 154 | 170 | 185 | 175 | 195 | 172 | 191 | 173 | 189 | 185 | 272 |
| Exothermic peak temperature (° C.) | | 245 | 230 | 171 | 140 | 195 | 174 | 212 | 190 | 210 | 209 | 220 | 190 | >250 |

Examples 1-12 and Comparative Example 1

Components (A), (B), (C) and (D) shown in Tables 2 and 3 were combined together with the solvents also shown in the tables, to obtain photosensitive resin composition solutions for Examples 1-12 and Comparative Example 1. The contents (g) of each component are also shown in the tables.

TABLE 2

| Materials | | Example 1 | Example 2 | Example 3 | Example 4 | Example 5 | Example 6 |
|---|---|---|---|---|---|---|---|
| Component (A) | A-1 | 50 | 50 | — | — | — | — |
| | A-2 | — | — | 50 | — | — | — |
| | A-3 | — | — | — | 50 | — | — |
| | A-4 | — | — | — | — | 50 | — |
| | A-5 | — | — | — | — | — | 50 |
| Component (B) | HABI*[1] | 3 | 3 | 3 | 3 | 3 | 3 |
| | EAB*[2] | 0.2 | 0.2 | 0.2 | 0.2 | 0.2 | 0.2 |
| Component (C) | BIP-T*[3] | 0 | 1 | 1 | 1 | 1 | 1 |
| Component (D) | P-1*[4] | 50 | 50 | 50 | 50 | 50 | 50 |
| coloring agent | Leucocrystal violet | 0.5 | 0.5 | 0.5 | 0.5 | 0.5 | 0.5 |
| Solvent | N,N-dimethyl-formamide | 4 | 4 | 4 | 4 | 4 | 4 |
| | Toluene | 4 | 4 | 4 | 4 | 4 | 4 |
| | Acetone | 10 | 10 | 10 | 10 | 10 | 10 |

*[1] HABI (trade name of Hodogaya Chemical Co., Ltd.): 2,2'-bis(o-chlorophenyl)-4,5,4',5'-tetraphenyl-1,2'-biimidazole
*[2] EAB (trade name of Hodogaya Chemical Co., Ltd.): 4,4'-bis(diethylamino)benzophenone
*[3] BIP-T (trade name of Asahi Denka Kogyo Co., Ltd.): bis(4-t-bulylphenyl)iodonium triflate
*[4] P-1: Methacrylic acid/methyl methacrylate/styrene copolymer (mass ratio: 25/50/25, weight-average molecular weight: 55,000, acid value: 163.1 mgKOH/g)

TABLE 3

| Materials | | Example 7 | Example 8 | Example 9 | Example 10 | Example 11 | Example 12 | Comp. Ex. 1 |
|---|---|---|---|---|---|---|---|---|
| Component (A) | A-6 | 50 | — | — | — | — | — | — |
| | A-7 | — | 50 | — | — | — | — | — |
| | A-8 | — | — | 50 | — | — | — | — |
| | A-9 | — | — | — | 50 | — | — | — |
| | A-10 | — | — | — | — | 50 | — | — |
| | A-11 | — | — | — | — | — | 50 | — |
| | 4G*[5] | — | — | — | — | — | — | 50 |
| Component (B) | HABI | 3 | 3 | 3 | 3 | 3 | 3 | 3 |
| | EAB | 0.2 | 0.2 | 0.2 | 0.2 | 0.2 | 0.2 | 0.2 |
| Component (D) | P-1 | 50 | 50 | 50 | 50 | 50 | 50 | 50 |
| coloring agent | Leucocrystal violet | 0.5 | 0.5 | 0.5 | 0.5 | 0.5 | 0.5 | 0.5 |
| Solvent | N,N-dimethyl-formamide | 4 | 4 | 4 | 4 | 4 | 4 | 4 |
| | Toluene | 4 | 4 | 4 | 4 | 4 | 4 | 4 |
| | Acetone | 10 | 10 | 10 | 10 | 10 | 10 | 10 |

*[5] 4G (trade name of Shin-Nakamura Chemical Co.,Ltd.): Tetraethyleneglycol dimethacrylate The obtained photosensitive resin composition solution was evenly applied onto a 16 μm-thick polyethylene terephthalate film and dried for 10 minutes with a hot-air convection drier at 100° C., to obtain a photosensitive element. The film thickness of the photosensitive resin composition layer of the obtained photosensitive element was 25 μm.

Next, the copper surface of a copper-clad board (trade name: MCL-E-67 by Hitachi Chemical Co., Ltd.), comprising a glass epoxy material laminated on both sides with a copper foil (35 μm thickness), was polished using a polishing machine (product of Sankei Co., Ltd.) with a #600 equivalent brush, and then rinsed with water and dried with an air stream.

The copper-clad board obtained in this manner was heated to 80° C., and then the previously obtained photosensitive element was laminated with the photosensitive resin composition layer attached to the copper surface, with a pressure of 0.4 MPa at a temperature of 120° C.

The photosensitive element-laminated copper-clad board was then cooled, and upon reaching 23° C., there were attached to the polyethylene terephthalate side a phototool having a 41-step tablet with a density range of 0.00-2.00, a density step of 0.05, a tablet size of 20 mm×187 mm, and a step size of 3 mm×12 mm, and a phototool having a circuit pattern with a line width/space width ratio of 6/6-35/35 (units: μm) as the resolution evaluation negative, and light exposure was performed using a parallel ray exposure device (trade name: EXM-1201 by Orc Manufacturing Co., Ltd.) with a 5 kW short arc lamp as the light source, at a dose leaving 14 stages, 17 stages and 20 stages after development of the 41-step tablet. The dose which left 17 stages after development of the 41-step tablet was recorded as the sensitivity of each photosensitive element.

Next, the polyethylene terephthalate film was removed and a 1.0 mass % aqueous sodium carbonate solution was sprayed for 24 seconds at 30° C. for removal of the unexposed sections.

The resolution is evaluated based on the smallest value of the space width between lines whereby the unexposed sections can be cleanly removed by developing treatment, without meandering or breaking of the lines. The sensitivity and resolution are both considered more satisfactory the smaller the value.

The release start time for the photocured product was measured in the following manner. Specifically, a sample irradiated with a dose (17/41 stages) corresponding to each sensitivity was developed in 1 mass % aqueous sodium carbonate.

After standing for approximately 24 hours, the photocured product was heated for 20 minutes with a hot-air convection drier at 170° C. and then cooled to room temperature, after which the sample was dipped in a 3 mass % aqueous sodium hydroxide solution while stirring at 45° C., and the time (sec) until release of the photocured product began was measured. A shorter release start time is preferred. The sensitivities, resolutions and release start times for Examples 1-12 and Comparative Example 1 are shown in Tables 4 and 5.

TABLE 4

|  |  | Example 1 | Example 2 | Example 3 | Example 4 | Example 5 | Example 6 |
|---|---|---|---|---|---|---|---|
| Sensitivity (mJ/cm$^2$) |  | 65 | 60 | 65 | 65 | 60 | 55 |
| Resolu- | ST = 14/41 | 15 | 18 | 15 | 18 | 18 | 15 |
| tion (μm) | ST = 17/41 | 18 | 15 | 15 | 18 | 15 | 18 |
|  | ST = 20/41 | 18 | 20 | 18 | 20 | 22 | 22 |
| Release start time (sec) |  | 18 | 14 | 13 | 12 | 17 | 18 |

TABLE 5

|  |  | Example 7 | Example 8 | Example 9 | Example 10 | Example 11 | Example 12 | Comp. Ex. 1 |
|---|---|---|---|---|---|---|---|---|
| Sensitivity (mJ/cm$^2$) |  | 80 | 80 | 85 | 85 | 75 | 120 | 55 |
| Resolu- | ST = 14/41 | 18 | 16 | 20 | 20 | 18 | 20 | 18 |
| tion | ST = 17/41 | 20 | 18 | 20 | 20 | 20 | 25 | 20 |
| (μm) | ST = 20/41 | 20 | 20 | 25 | 25 | 25 | 25 | 20 |
| Release start time Sec |  | 30 | 25 | 25 | 20 | 60 | 150 | 315 |

INDUSTRIAL APPLICABILITY

As explained above, the present invention can provide a photosensitive resin composition capable of adequately improving removability while maintaining excellent resolution, as well as a photosensitive element, a resist pattern forming method, a process for manufacturing a printed circuit board and a method for removing a photocured product.

The invention claimed is:

1. A photosensitive resin composition comprising (A) a photopolymerizing compound with two or more ethylenic unsaturated bonds in the molecule and (B) a photopolymerization initiator which initiates photopolymerization reaction of the (A) photopolymerizing compound,
the photosensitive resin composition being characterized in that the molecule of said (A) photopolymerizing compound further contains a characteristic group with a bond which breaks when said (A) photopolymerizing compound is heated under temperature conditions of 130-250° C.

2. A photosensitive resin composition according to claim 1, characterized by further comprising (C) a compound which generates an acid upon heating at 130° C. or above or irradiation with active light rays.

3. A photosensitive resin composition according to claim 1, characterized by further comprising (D) a binder polymer.

4. A photosensitive resin composition according to claim 1, characterized in that said characteristic group has a structure represented by the following general formula (1)

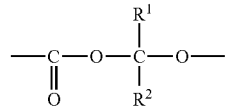

(1)

[in formula (1), R$^1$ and R$^2$ each independently represent hydrogen atom or a C1-20 alkyl group].

5. A photosensitive resin composition according to claim 1, characterized in that said characteristic group has a structure represented by the following general formula (2)

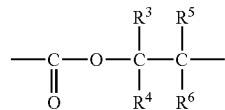

(2)

[in formula (2), R$^3$ and R$^4$ each independently represent a C1-20 alkyl group, and R$^5$ and R$^6$ each independently represent hydrogen atom or a C1-20 alkyl group].

6. A photosensitive resin composition according to claim 1, characterized in that said characteristic group has a structure represented by the following general formula (3)

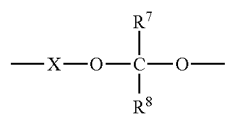

(3)

[in formula (3), R$^7$ and R$^8$ each independently represent hydrogen atom or a C1-20 alkyl group, and X represents a divalent organic group].

7. A photosensitive resin composition according to claim 1, characterized in that said characteristic group has a structure represented by the following general formula (4)

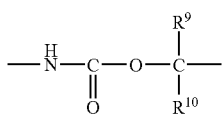

(4)

[in formula (4), $R^9$ and $R^{10}$ each independently represent a C1-20 alkyl group].

8. A photosensitive element characterized by comprising a support film and a photosensitive resin composition layer composed of a photosensitive resin composition according to claim 1 formed on said support film.

9. A resist pattern forming method characterized by laminating a photosensitive resin composition layer composed of a photosensitive resin composition according to claim 1 onto a circuit-forming board, exposing prescribed sections of said photosensitive resin composition layer to active light rays for photocuring of the exposed sections, and then removing the non-exposed sections.

10. A resist pattern forming method characterized by laminating the photosensitive resin composition layer of a photosensitive element according to claim 8 onto a circuit-forming board, exposing prescribed sections of said photosensitive resin composition layer to active light rays for photocuring of the exposed sections, and then removing the non-exposed sections.

11. A process for manufacturing a printed circuit board, characterized by comprising
    a circuit-forming step in which a circuit-forming board having a resist pattern formed thereon by a resist pattern forming method according to claim 9 is subjected to etching or plating, and
    a removal step in which said resist pattern is removed from said circuit-forming board either during or after heating to 130-250° C.

12. A method for removing a photocured product characterized in that a photocured product obtained by laminating a photosensitive resin composition layer composed of a photosensitive resin composition according to claim 1 onto a support board and exposing it to active light rays for photocuring of said photosensitive resin composition layer, is removed from said support board either during or after heating to 130-250° C.

13. A method for removing a photocured product characterized in that a photocured product obtained by laminating the photosensitive resin composition layer of a photosensitive element according to claim 8 onto a support board and exposing it to active light rays for photocuring of said photosensitive resin composition layer, is removed from said support board either during or after heating to 130-250° C.

14. A photosensitive resin composition according to claim 1, wherein the molecule of said (A) photopolymerizing compound contains said characteristic group with said bond which breaks when said (A) photopolymerizing compound is heated under temperature conditions of 130-250° C. such that decomposition of the photosensitive resin composition or a photocured product of the photosensitive resin composition occurs upon heating under said temperature conditions.

15. A photosensitive resin composition according to claim 1, wherein said (A) photopolymerizing compound has a weight-average molecular weight of 5,000-300,000.

16. A photosensitive resin composition according to claim 1, wherein said bond of said characteristic group breaks when said (A) photopolymerizing compound is heated under temperature conditions of 150-200° C.

17. A photosensitive resin composition comprising (A) a photopolymerizing compound with two or more ethylenic unsaturated bonds in the molecule and (B) a photopolymerization initiator which initiates photopolymerization reaction of the (A) photopolymerizing compound,
    the photosensitive resin composition being characterized in that the molecule of said (A) photopolymerizing compound further contains a characteristic group with a bond which breaks when said (A) photopolymerizing compound is heated under temperature conditions of 130-250° C. so as to increase removability of the photosensitive resin composition or cured product thereof during or after heating under said temperature condition, as compared to prior to said heating.

* * * * *